(12) United States Patent
Baumgartner et al.

(10) Patent No.: US 8,799,837 B2
(45) Date of Patent: Aug. 5, 2014

(54) OPTIMIZING A NETLIST CIRCUIT REPRESENTATION BY LEVERAGING BINARY DECISION DIAGRAMS TO PERFORM REWRITING

(75) Inventors: Jason Baumgartner, Austin, TX (US); Geert Janssen, Putnam Valley, NY (US); Robert Kanzelman, Rochester, MN (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1298 days.

(21) Appl. No.: 12/197,980

(22) Filed: Aug. 25, 2008

(65) Prior Publication Data

US 2010/0050145 A1    Feb. 25, 2010

(51) Int. Cl.
*G06F 17/50* (2006.01)

(52) U.S. Cl.
USPC .......................... 716/103; 716/104; 716/132

(58) Field of Classification Search
CPC ............................ G06F 17/505; G06F 17/5045
USPC ......................................... 716/100–107, 132
See application file for complete search history.

(56) References Cited

U.S. PATENT DOCUMENTS

| 5,712,792 | A | * | 1/1998 | Yamashita et al. ............ 716/104 |
| 6,086,626 | A | | 7/2000 | Jain et al. |
| 7,120,883 | B1 | | 10/2006 | Van Antwerpen et al. |
| 2002/0010899 | A1 | | 1/2002 | Wallace |
| 2005/0289210 | A1 | | 12/2005 | Langsdorf |
| 2006/0075375 | A1 | * | 4/2006 | Rana et al. ....................... 716/18 |
| 2006/0129958 | A1 | * | 6/2006 | Raymond et al. ................. 716/5 |
| 2006/0190873 | A1 | | 8/2006 | Baumgartner et al. |
| 2006/0236274 | A1 | * | 10/2006 | Baumgartner et al. ........... 716/3 |
| 2006/0277508 | A1 | | 12/2006 | Baumgartner et al. |
| 2008/0222590 | A1 | * | 9/2008 | Jacobi et al. .................... 716/12 |

FOREIGN PATENT DOCUMENTS

| JP | 0527678 A2 | 10/1993 |
| JP | 0413831 B1 | 6/1999 |

OTHER PUBLICATIONS

J.-H. R. Jiang and R. K. Brayton; "Functional dependency for verification reduction"; In Proc. CAV, pp. 268-280, 2004.

P. Bjesse and A. Boralv; "DAG-aware circuit compression for formal verification": In Proc. 2004 IEEE/ACM Int'l Conf on CAD, pp. 42-49; (2004); ISBN:0-7803-8702-3.

* cited by examiner

*Primary Examiner* — Paul Dinh
(74) *Attorney, Agent, or Firm* — Brevetto Law Group

(57) ABSTRACT

Leveraging existing Binary Decision Diagrams (BDDs) to enhance circuit reductions in a system model representing a state machine as a netlist. The netlist is evaluated to determine the regions with the greatest potential reductions. BDD sweeping is performed to identify redundancies in the netlist. BDD rewriting implements the circuit reductions by replacing gates of the original netlist with more efficient equivalent logic.

28 Claims, 6 Drawing Sheets

OPTIMIZING A NETLIST CIRCUIT REPRESENTATION BY LEVERAGING BINARY DECISION DIAGRAMS TO PERFORM REWRITING

BACKGROUND

1. Field

The present invention relates to modeling and testing digital designs of state machines, and more specifically, to systems, methods and computer products for optimizing netlist representations to aid in logic design and verification.

2. Background

Computerized system modeling is useful in optimizing and improving the design of electrical circuits and other systems that include state holding elements. Such systems may be modeled using state equations and state variables that describe the behavior and state of the system. A complete set of state variables for a system typically contains enough information about the system's history to enable computation of the system's future behavior. Computer-aided design (CAD) modeling may be used in an effort to simplify a state equation model, reducing the number of state variables and lessening the computational cost of analyzing the model. CAD logic synthesis optimization techniques may be employed in an attempt to render smaller designs to enhance chip fabrication processes.

A number of techniques have been proposed for reducing the size of a structural design representation. One such technique, redundancy removal, attempts to identify gates in the design that have the same function and merge one into the other. Another technique is subexpression elimination, wherein selected logic expressions are rewritten in an attempt to enable a representation with fewer gates. For example, given two expressions—A&B&C and D&A&B—subexpression elimination would translate those to (A&B)&C and (A&B)&D. This enables the sharing of node (A&B) between both expressions, thus requiring a total of three 2-bit AND expressions vs. four. Another set of techniques attempts to rewrite portions of the logic as alternative structure using fewer gates. However, such subexpression elimination algorithms tend to be limited in scope as they optimize the logic "locally" at only a few levels deep, or are limited to portions with a set number of inputs to compensate for the computational expense of investigating a greater set of choices.

What is needed is an efficient way to rewrite portions of the logic in a structural design representation.

SUMMARY

The embodiments disclosed herein address the above stated needs by providing systems, methods and computer products for rewriting portions of the logic in a structural design representation. The algorithms leverage Binary Decision Diagrams (BDDs) to perform a more global optimization, and are robust in the sense that they do not increase design size. The various embodiments leverage available BDDs (e.g., already constructed using BDD-sweeping) for nodes in a structural graph representation by deriving more optimal structure from them and replacing the logic for the node with this new structure. This tends to reduce the overall netlist size. Further, some embodiments construct new BDDs for portions of the logic such as to subsequently leverage these optimized BDDs for rewriting as optimal structure. Heuristics are provided in some embodiments for identifying portions of the logic for which to build BDDs, to get maximal benefit by way of rewriting the logic for those portions with new logic derived from the constructed BDDs. This tends to avoid building BDDs for portions of logic which will not benefit from said rewriting to reduce overall resources.

Various embodiments obtain the BDD representations associated with a node in the netlist, identify a reduction in the netlist by synthesizing one of the BDD representations as a netlist region associated with the node. Based on the identified reduction a new netlist representation can be created for that netlist region of the node.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1:
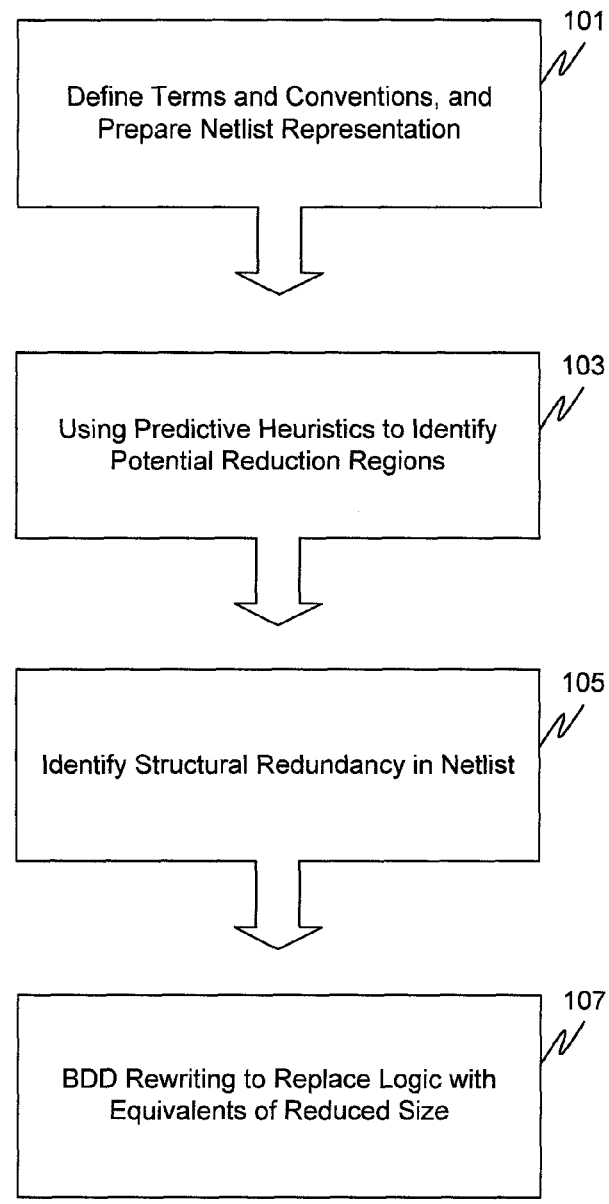
FIG. 1 is an overview flowchart depicting methods and processes performed in accordance with various aspects of the present invention.

FIG. 1 is a flowchart 100 depicting an overview of methods and processes performed in accordance with various embodiments. CAD modeling can be used to improve the design of electrical circuits that have state holding elements. CAD modeling tasks include, for example, equivalence checking, property checking, logic synthesis and false-paths analysis. These tasks generally entail Boolean reasoning on problems derived from circuit structures. One approach for such applications is to represent the problem structurally as a circuit graph. A circuit graph representation is non-canonical and provides for ways to make it more compact for effective Boolean reasoning. Techniques for reducing the size of a design representation are important in a number of applications, including, for example, electrical circuit verification and analysis and making design improvements to enhance chip fabrication processes. However, the resources needed for verification of designs are proportional to design size. Simulation tends to scale polynomially, while formal verification scales exponentially, and emulators are gated in their capacity by design size and maximum logic depth.

Various embodiments disclosed herein address the above stated needs by providing systems, methods and computer products for rewriting portions of the logic in a structural design representation. The algorithms are programmable and controlled by resource limits such that they can be made more effective at the expense of computational complexity. A number of heuristics are disclosed for netlist reduction, thus allowing for increasingly aggressive optimizations as warranted by the overlying application.

Turning to FIG. 1, one of the first tasks of the method 100 is to define the conventions and terms, set the initial conditions of the system model, and prepare a sequential design representation in block 101. Preparing a sequential design representation often entails defining a netlist for the system design. An exemplary netlist contains a directed graph with vertices representing gates, and edges representing interconnections between those gates. The gates have associated functions, such as constants, primary inputs (which may be referred to as RANDOM gates), combinational logic such as AND gates, and sequential state holding elements. A sequential state holding element has one or more inputs and at least one output, each of which may be characterized by discrete states (e.g., 1 or 0). The various embodiments can be practiced with any sort of state machine including state holding elements (e.g., registers, latches, RAM circuitry, or the like). For illustrative purposes the terms "register," "gate" and "variable" are used interchangeably throughout this disclosure since certain netlist analysis techniques reason about variables. The state of the output (or the state of each output, if more than one) is determined by the previous states of the input channels. The initialization time or reset time of a register is referred to herein as time zero (t=0). Registers typically have two associated components, their next-state functions and their initial-value functions. Both of these associated components may be represented as other gates in the graph. Semantically, for a given register the value appearing at its initial-value gate at time "0" will be applied as the value of the register itself. The value appearing at its next-state function gate at time "i" will be applied to the register itself at time "i+1".

Certain gates of the model may be labeled as targets. Targets correlate to the properties we wish to verify. One goal of the verification process is to find a way to drive a "1" to a target node, or to prove that no such assertion of the target is possible—that is, to verify whether or not the target node is reachable. Another goal may be to generate a counterexample trace illustrating this scenario, if one is found. In at least some embodiments a netlist representation may be prepared using as the only combinational gate type a 2-input AND gate. Inversions in these embodiments may be represented implicitly as edge attributes. This assumption is not critical to practicing all embodiments, although they do increase the power thereof by merely "shifting" to an alternate logic representation. Upon completion of the conventions, terms, initial conditions and system model in 101, the method proceeds to 103.

In block 103 predictive heuristics are used to identify regions most likely to be reducible. The process of 103 is described in further detail in conjunction with FIG. 2. Once the regions of potential reduction have been identified and selected in 103 the method proceeds to 105. Block 105 entails a method of identifying structural redundancy in the netlist representation, for example, by BDD sweeping. The BDD sweeping of 105 is described in further detail in conjunction with FIG. 3. Once the BDD sweeping is completed in 105 the method proceeds to 107. In block 107 BDD rewriting is performed to replace logic with equivalents of reduced size. The BDD rewriting of 107 is described in further detail in conjunction with FIG. 4.

Figure 2:
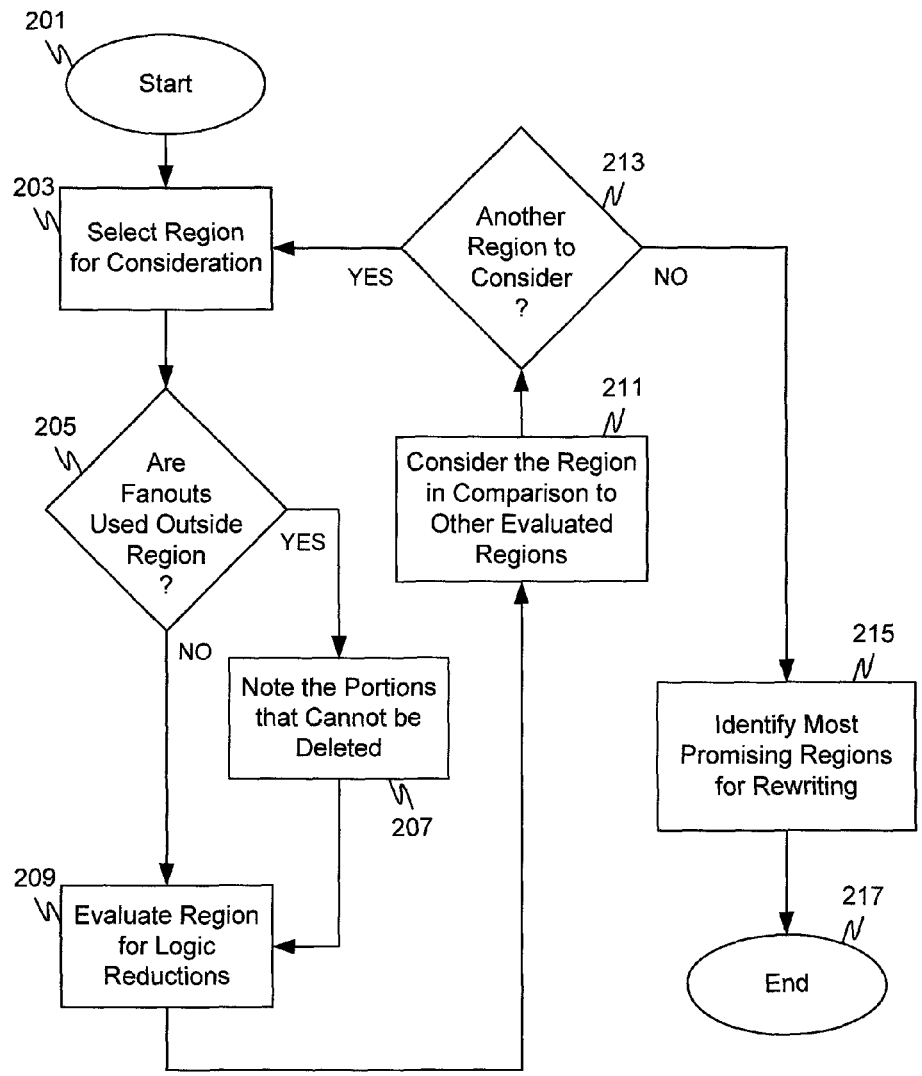
FIG. 2 is a flowchart depicting a method of using predictive heuristics to identify regions of greatest potential reduction.

FIG. 2 is a flowchart depicting a method 200 of using predictive heuristics to identify regions of greatest potential reduction. This is done in preparation for BDD rewriting, which is described further in conjunction with FIG. 4. The regions to be evaluated are generally subsets within netlist nodes. By using such heuristics portions of the logic may be identified that are likely to result in rebuilt BDDs that get maximal benefit of circuit reduction. The reductions are achieved by rewriting the logic for those portions with new logic derived from the constructed BDDs, while avoiding the building of BDDs for portions of logic which will not benefit from said rewriting to reduce overall resources.

The method 200 begins at 201 and proceeds to 203 to select a region for consideration. Various heuristics may be used to select portions likely to gain maximal benefit from BDD-rewriting. In some embodiments the process of proposing a region for consideration in 203 may involve determining whether the region is sufficiently large. As can be expected, BDD rewriting may be sensitive to what portions of the logic are chosen for rewriting, and the benefits from the technique may not be realized for every choice.

Given other techniques available for rewriting such as 4-input rewriting, or 2-level rewriting, BDD rewriting may not generally prove to be very effective over the power of those other techniques if the regions chosen are very small or local in nature. Hence, various embodiments attempt to apply BDD rewriting to somewhat larger regions where other structural rewriting techniques tend to run out of steam due to an explosion in the number of possible logic representations of the logic that need to be considered. In practice, however, the selected region may be of any size suitable to work with within the processing and storage constraints of the computing system. A typical BDD size may be several thousand nodes, for example, in the range of 1,000 to 20,000 nodes. However, the various embodiments may be used with larger or smaller sized BDDs. Larger sized BDDs are expected in view of the trend toward computers with increasing processing and storage capabilities. If it is determined that the region is of adequate size and otherwise acceptable for consideration the method proceeds from 203 to 205.

Block 205 determines whether any fanouts from the region being considered are used outside the region (hence, causing problems if the circuitry is replaced). Fanouts from the region being considered directly impact whether or not the logic to be rewritten can be deleted after replacement, or will have to be retained due to it being shared by other logic outside the region. It is sometimes the case that maximal benefit can be realized by rewriting portions of the logic that do not fanout to any other logic, thus allowing all of the original logic to be discarded and replaced with the newly synthesized logic. Various embodiments disclosed herein attempt to uncover sufficiently large portions of the logic that are fanout free and with the benefits of performing non-local rewriting while deriving maximal gain via replacing the logic being rewritten completely. If it is determined in 205 that there are fanouts in the region being considered that tie to circuitry outside the region, then the method proceeds from 205 along the "YES" path to 207 to note the dependent fanout regions. The method then proceeds from 207 to 209. Back in 205 if it is determined that there are not any dependent fanouts in the region being considered the method proceeds from 205 along the "NO" path to 209. In block 209 the region is evaluated for logic reductions. This may be done in any of several manners. For example, the BDD sweeping method described in conjunction with FIG. 3 may be used to determine reductions to the region.

In addition to considering size (part of block 203), the existence/absence of fanouts (block 205), and the possible logic reductions (block 209), other considerations may come into play in some embodiments. For example, the heuristics for selecting logic to be rewritten may be natively intertwined with the rewriting approach that is selected. When building dedicated BDDs for the purposes of rewriting, BDDs are built to within the constraints of specified resource limits, subject to a threshold that limits the sizes of the built BDDs. Note that BDDs for nodes in the cone-of-influence of the nodes up to which BDD building has propagated are freed to minimize resource consumption. Next, the nodes which are to be rewritten are addressed up to this point as cutpoints. Fresh BDDs are built starting at these cutpoint nodes to propagate BDDs deeper into the netlist. This iteratively builds BDDs for deeper nodes to "cover" all the nodes in the netlist with BDDs for the purposes of rewriting. This approach heursitically selects optimal portions of the netlist for rewriting, while reducing the total number of BDDs that need to be built.

Upon completing the evaluation of the region for logic reductions in 209 the method proceeds to 211 to consider the present region in view of other regions previously evaluated. If, in response to this evaluation, the current region proves to be a viable candidate for rewriting or redesign the region is noted in 211 for future reference. The method then proceeds to 213. In block 213 it is determined whether or not any other regions are to be considered. If another region is to be considered the method proceeds from 213 along the "YES" branch back to 203. If, however, there are no further regions of the netlist to consider the method proceeds from 213 along the "NO" branch to 215. In 215 the regions deemed to be most promising to yield reductions are identified for rewriting or other design modifications. Upon completing 215 the method proceeds to 217 and ends.

Figure 3:
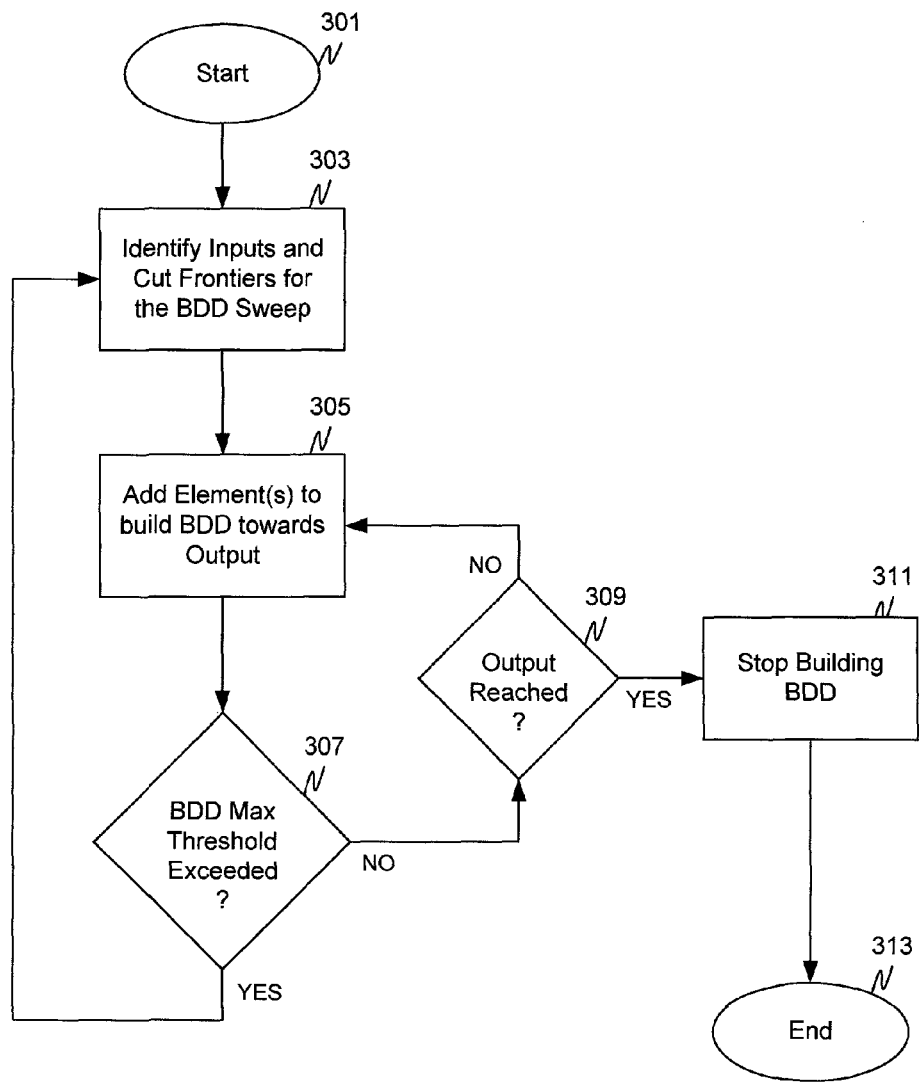
FIG. 3 is a flowchart depicting a method of binary decision diagram sweeping to identify structural redundancy in the netlist.

FIG. 3 is a flowchart depicting a method 300 of identifying structural redundancy in the netlist through dependent next state identification. A process of identifying structural redundancy is also described in pending U.S. patent application 2006/0230366 which is assigned to IBM, the same assignee as the present patent, and having three inventors in common with this patent. The 2006/0230366 published U.S. patent application is hereby incorporated by reference herein in its entirety. The process of identifying state variables in a design (e.g. latches or registers) that can be expressed as combinational (Boolean) functions of other state variables is called dependent state element identification. A special case of dependent state variables are redundant state variables, in which two registers evaluate to the same value at all points in time. For example, one register may be expressible as a function of other registers, e.g., register1 may be equal to the AND of register2 and register3 for all points in time. In such a situation, the register1 state variable is said to be redundant in view of register2 and register3.

One technique for identifying structural redundancy in netlists essentially builds BDDs for individual graph vertices starting from the inputs and cut frontiers and proceeding towards the outputs. By maintaining cross-references between the graph vertices and the BDD for the vertex, functionally equivalent vertices can be identified and merged, and their fanouts combined, thus reducing problem size. The maximum size of BDDs is limited by a predefined threshold dependent upon the available computing resources and reasoning power. BDDs of size greater than the threshold are discarded. Once the processing of BDDs in this manner terminates, the algorithm tries to identify advantageous cutpoints. Such cutpoints are typically vertices having one or more of the following characteristics: large fanouts; have been previously merged; and/or are on the border of the intersection of the two cones that form the miter (in the case of equivalence checking).

Returning to FIG. 3, the method 300 starts at 301 and proceeds to 303 to identify inputs and cut frontiers for the BDD sweep. This may be done in any of several manners, including performing the method described above in conjunction with FIG. 2. Once the inputs and cut frontiers have been decided for the BDD sweep the method proceeds from 303 to 305. In block 305 one or more elements are added to build the BDD outward towards the output. Upon adding an element in block 305 the method proceeds to 307.

Block 307 checks the newly formed logic to see if a predetermined BDD threshold has been exceeded. The BDD threshold may be set at a given amount to stop the building of BDDs if the size exceeds the imposed threshold. This helps to avoid exceeding available resources due to an overly large BDD. If the BDD max threshold is exceeded in block 307 without reaching the output the method proceeds along the "YES" path back to 303 to stop building the present BDD and insert cutpoints to start building new BDDs such that all BDDs are below the threshold. For example, say we started building BDDs at the inputs, and we obtain BDD for a node 'a' in the netlist but when we try to build BDD for node 'b' which is the fanout of 'a' the BDD size is greater that the threshold. Then we stop building BDD for node 'b' and instead insert a cutpoint at 'a' and make it an input variable for nodes downstream from 'a'. Next we start building BDDs from 'a' forward and now the BDD for 'b' will be a small BDD. We continue doing this till we get to the outputs. Hence, the BDD for an output may not start at an input, instead may start from an internal netlist node. If the BDD maximum threshold has not been exceeded the method proceeds from 307 along the "NO" path to 309.

If it is determined in 309 that the output has not yet been reached the method proceeds from 309 along the "NO" branch back to 305 to add another element for the BDD. Once the output has been reached, as determined in block 309, the method proceeds along the "YES" branch from 309 to 311 and terminates.

It should be noted that the technique for identifying structural redundancy is controlled by resource limits. BDDs may be propagated as deep as desired, based on available resources such as time and/or memory. This has the effect of leveraging the BDDs locally as well as globally to take advantage of rewriting for small portions of the netlist, and for large cones of logic where there may be greater potential for realizing reductions. In this context, various embodiments can implement multiple iterations of BDD rewriting, alternated with other techniques such as 4-input rewriting. Further, BDD rewriting can be performed iteratively for progressively higher BDD size limits to effectively broaden its scope and slowly work its way from a local to a more global optimization. When doing the former it helps to further crunch down the netlist immediately by leveraging 4-input rewriting to uncover sharing amongst the newly created nodes via BDD synthesis to get a more optimal reduction.

Figure 4:
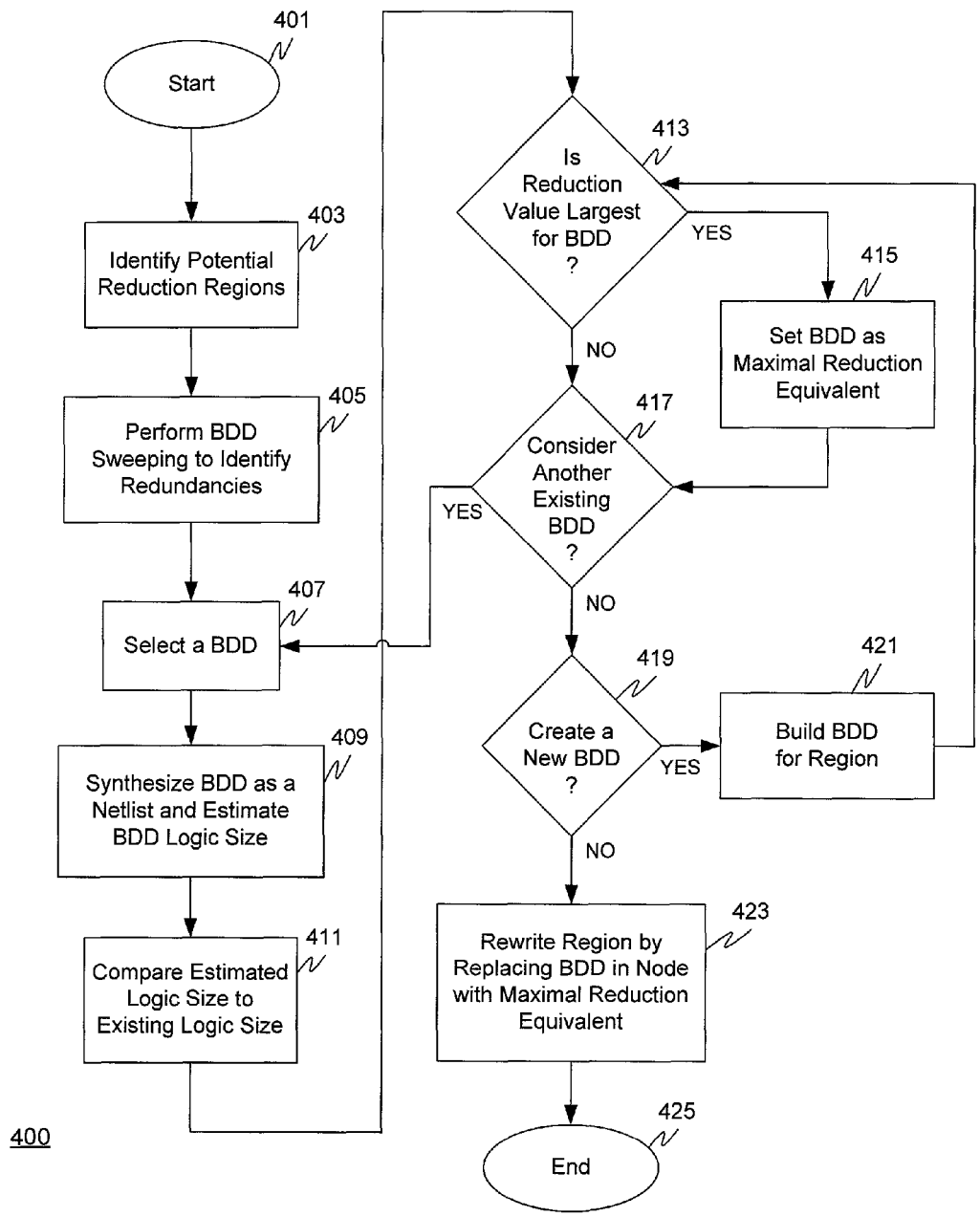
FIG. 4 is a flowchart depicting a method of binary decision diagram rewriting to replace logic for a given region of the circuit with equivalents of reduced size.

FIG. 4 is a flowchart depicting a method of binary decision diagram rewriting to replace logic with equivalents of reduced size. Once the BDD-sweeping algorithm has terminated and identified all redundancy that it can, various embodiments are used to leverage the exisiting BDDs for "BDD-rewriting," for example, as depicted in FIG. 4. In general this is achieved by looping through all the available BDDs for each node, computing an estimate of the size of the logic that can be synthesized from each BDD, and comparing that to the size of the existing logic within the portion of the cone-of-influence of the node bounded by the gates corresponding to the support of the BDD. Note that this is done for each BDD for the node, some of which may have been initiated at a cut-frontier, implying that the cut-frontier forms the boundary for any cone-of-influence traversal of the logic for that node. From this the BDD is selected that, if synthesized as structure, provides the maximal reduction in the logic representation for the node, inclusive of checking against the original structural representation of the logic for the node.

Such a scheme can often be made to be more accurate by way of synthesizing each of the BDDs as structure to see how many nodes it requires, and subsequently deleting those nodes if the structure does not bring about any reduction, or we may approximate it by assuming that the BDD synthesis will require three times as many AND gates as the size of the BDD, since the BDD synthesis is done using a MUXing strucuture that creates at most three nodes for every BDD node: ((bdd_variable_gate AND synthesis_of_BDD1_child_node) OR (NOT(bdd_variable_gate) AND synthesis_of_BDD0_child_node)). In actuality the structure added is often much less than 3× due to sharing amongst the nodes synthesized, and sharing with existing nodes in the netlist representation. Finally, the nodes for which the BDD synthesis results in a size (of the logic cone) reduction are replaced with reduced sized nodes. This results in an overall reduction in the netlist size which is very beneficial for the overlying applications that work on the netlist such as SAT, or structural traversal, or the like.

Turning now to FIG. 4, the method 400 begins at 401 and proceeds to 403 for identification of potential reduction regions. One way of doing this is through the use of predictive heuristics as described above in conjunction with FIG. 2, or in any other manner that suits the constraints of the situation. Once the potential reduction regions have been identified the method proceeds from 403 to 405. In block 405 the circuitry redundancies are identified, for example, by BDD sweeping as described above in conjunction with FIG. 3. Upon completing the BDD sweeping or otherwise identifying the circuitry redundancies the method proceeds from 405 to 407 to select a BDD for the node or other region being considered. The selection of an existing BDD in 407 has the effect of leveraging the existing BDDs available from BDD-sweeping. The selected BDD is then available for evaluation to use in rewriting logic for the region under consideration. Upon selecting a BDD in 407 the method proceeds to 409 to synthesize the BDD as a netlist and estimate the BDD logic size. Synthesizing the BDD means converting the BDD representation into a circuit or a netlist representation. A BDD represents a canonical decision diagram and is a data structure representing a logic function. When the BDD is synthesized it is converted from the decision diagram into a circuit with an equivalent function, as further described above, for example, the first paragraph above describing FIG. 4. In some instances this may be done at the time of BDD sweeping, that is, as part of the method described above in conjunction with FIG. 3.

Upon completing 409 the method proceeds to 411 to compare the estimated logic size to the existing logic size to determine whether the BDD offers a reduction in circuitry size. Once the comparison in 411 is made the method proceeds to 413 to determine whether the reduction value, if any, for the BDD being considered is the largest available reduction. If the reduction value is the largest encountered up to that time the method proceeds from 413 along the "YES" path to 415 to set the present BDD as the maximal reduction equivalent. However, back in 413 if the reduction value is not the largest reduction encountered the method proceeds from 413 to 417 to determine whether or not any other currently existing BDD is available to be considered. If another BDD is to be considered the method proceeds from 417 along the "YES" branch to 407 to select another BDD. However, if it is determined back in 417 that no further currently existing BDDs are to be considered the method proceeds from 417 along the "NO" path to 419.

In block 419 it is determined whether another BDD is to be created. In some embodiments this may be done in response to determining that sufficient reductions have not been achieved after considering the existing BDDS. If a new BDD is to be created the method proceeds from 419 along the "YES" branch to 421. In 421 a new BDD is created from the region being considered. This may be done, for example, in accordance with the method disclosed above in conjunction with FIG. 3, or by any other available method of constructing BDDs. Once the BDD is built in 421 the method proceeds to 413 to determine whether it offers larger circuitry reductions than any other previously considered BDDs. Returning to block 419, if it is determined that no new BDD is to be built the method proceeds from 419 along the "NO" path to 423.

In block 423 the system replaces the existing circuitry in the region under consideration with the BDD equivalent indicated to provide the maximal reduction (as noted in block 415). Upon implementing the BDD maximal reduction equivalent in 423 the method proceeds to 425 and ends. It should be noted that BDD procedures may be used in addition to the above methods to obtain further optimized BDDs prior to synthesizing the BDDs into logic. For example, this may be done by calling out dynamic variable ordering at various points in the above process depending on resources available and provided to the algorithm. The individual BDDs may be extracted and optimized in isolation before synthesizing them to logic as described above, to achieve greater local reduction. The BDDs that will yield a benefit after synthesis to structure may be collected and collectively subjected to dynamic variable ordering to get maximal sharing in the synthesized structure. This process can be summarized by first building BDDs representing the function of certain gates of the netlist with respect to certain internal cutpoints. Then, for each gate with a BDD built record the number of gates in the original netlist used to implement the function corresponding to the BDD. Optionally, dynamic variable ordering may be invoked to reduce size of the BDD, followed by taking an estimate how many gates it would take to synthesize that BDD. The rewrite candidates are sorted according to the potential size reduction obtained by replacing the corresponding gate by the synthesis of the BDD, i.e. by the size obtained above minus the estimate obtained. For each gate for which this subtraction results in a positive value (i.e., a reduction is obtained), the corresponding BDDs are synthesized and used to replace the corresponding gates of the original netlist.

Figure 5:
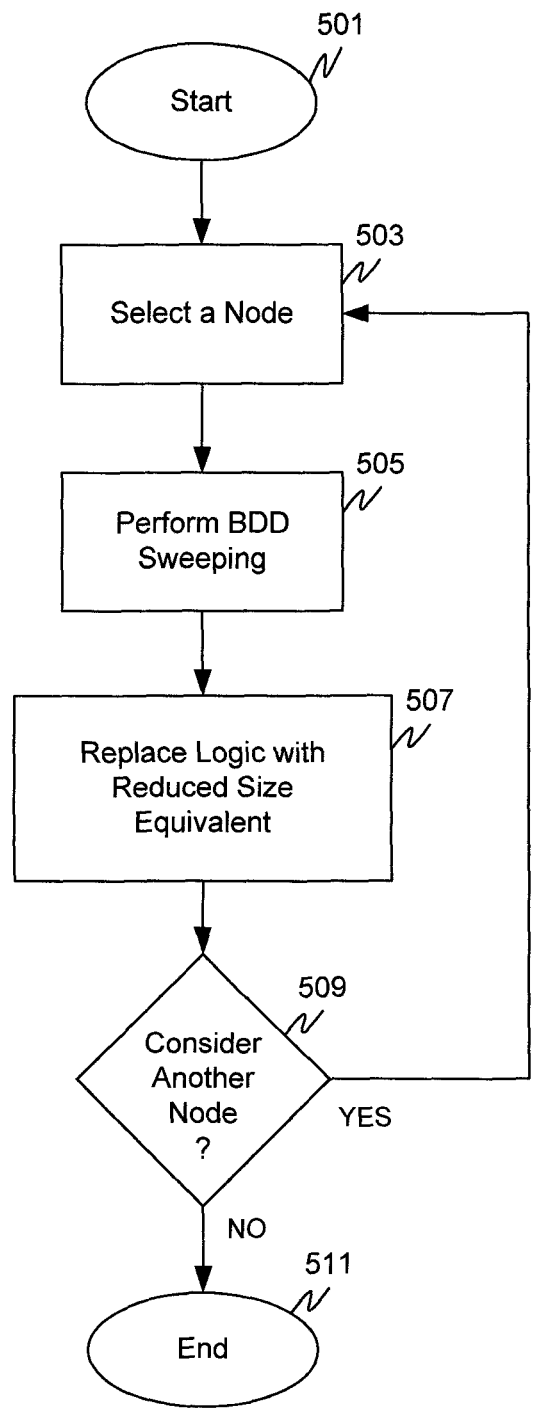
FIG. 5 is a flowchart depicting a method of reducing the netlist representation size for additional nodes in the circuit netlist.

FIG. 5 is a flowchart depicting a method of reducing the netlist representation size for additional nodes in the circuit netlist. The method begins in 501 and proceeds to 503 to select a node for realizing circuitry reductions by implementing various embodiments disclosed herein. Once a node has been selected in 503 the method proceeds to 505 to perform BDD sweeping and determine redundancies in the node's circuitry. This may be done in accordance with the method disclosed above in conjunction with FIG. 3. Upon completing 505 the method proceeds to 507 to evaluate the potential reductions, synthesize the BDD and rewrite the portion of the netlist being considered using the BDD with the greatest reduction. The procedure in block 507 for replacing the logic with reduced sized equivalent may be performed according the method disclosed above in conjunction with FIG. 4.

Upon completing 507 the method proceeds to 509. In block 509 the system determines whether another node is to be processed. To consider another node the method proceeds from block 509 along the "YES" path back to 503 to select another node. However, if it is determined in 509 that no other node is to be considered the method proceeds from 509 along the "NO" path to 511. The method ends in block 511.

Figure 6:
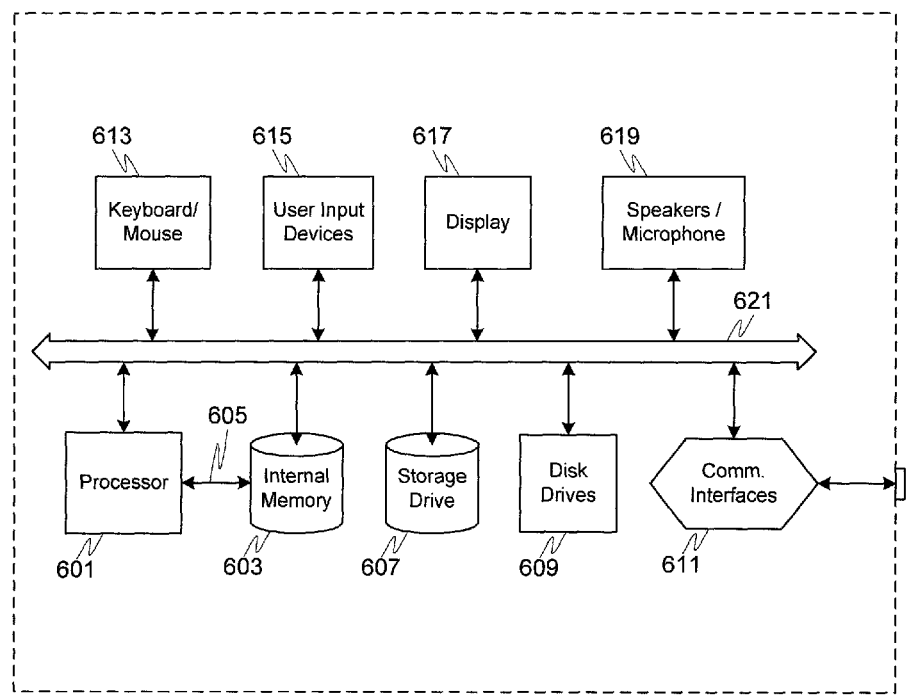
FIG. 6 depicts an exemplary computer system 600 suitable for implementing and practicing various exemplary embodiments.

FIG. 6 depicts an exemplary computer system 600 suitable for implementing and practicing various exemplary embodiments. The computer system 600 may be configured in the form of a desktop computer, a laptop computer, a mainframe computer, or any other arrangements capable of being programmed or configured to carry out instructions. The computer system 600 may be located and interconnected in one location, or may be distributed in various locations and interconnected via a local or wide area network (LAN or WAN), via the Internet, via the public switched telephone network (PSTN), or other such communication links. Although this passage describes a computer system 600 it is understood that other devices may also be suitable for implementing or practicing the embodiments, or a portion of the embodiments, including any device capable of being programmed to carry out instructions or routines.

Typically, a computer system 600 includes a processor 601 which may be embodied as a microprocessor or central processing unit (CPU). The processor 601 is typically configured to access an internal memory 603 via a bus such as the system bus 621. The internal memory 603 may include one or more of random access memory (RAM), read-only memory (ROM), cache memory, or a combination of these or other like types of circuitry configured to store information in a retrievable format. In some implementations the internal memory 603 may be configured as part of the processor 601, or alternatively, may be configured separate from it but within the same packaging. The processor 601 may be able to access internal memory 603 via a different bus or control lines (e.g., local bus 605) than is used to access the other components of computer system 600.

The computer system 600 also typically includes, or has access to, one or more storage drives 607 (or other types of storage memory) and floppy disk drives 609. Storage drives 607 and the floppy disks for floppy disk drives 609 are examples of machine readable mediums suitable for storing various final or interim results of the various embodiments. The storage drive 607 is often a hard disk drive configured for the storage and retrieval of data, computer programs or other information. The storage drive 607 need not necessary be contained within the computer system 600. For example, in some embodiments the storage drive 607 may be server storage space within a network or the Internet that is accessible to the computer system 600 for the storage and retrieval of data, computer programs or other information. For example, the computer system 600 may use storage space at a server storage farm accessible by the Internet or other communications lines. The floppy disk drives 609 may include a combination of several disc drives of various formats that can read and/or write to removable storage media (e.g., CD-R, CD-RW, DVD, DVD-R, floppy disk, etc.). The computer system 600 may either include the storage drives 607 and floppy disk drives 609 as part of its architecture (e.g., within the same cabinet or enclosure and/or using the same power supply), as connected peripherals, or may access the storage drives 607 and floppy disk drives 609 over a network, or a combination of these. The storage drive 607 is often used to store the software, instructions and programs executed by the computer system 600, including for example, all or parts of the computer application program for project management task prioritization.

The computer system 600 may include communication interfaces 611 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 600 may be connected to the Internet via the wireless router 401 (or a wired router or other node-not show) rather than have a direct connected to the Internet. The components of computer system 600 may be interconnected by a bus 621 and/or may include expansion slots conforming to any of various industry standards such as PCI (Peripheral Component Interconnect), ISA (Industry Standard Architecture), or EISA (enhanced ISA).

Typically, the computer system 600 includes one or more user input/output devices such as a keyboard and/or mouse 613, or other means of controlling the cursor (e.g., touchscreen, touchpad, joystick, trackball, etc.) represented by the user input devices 615. A display 617 is also generally included as part of the computer system 600. The display may be any of several types of displays, including a liquid crystal display (LCD), a cathode ray tube (CRT) monitor, a thin film transistor (TFT) array, or other type of display suitable for displaying information for the user. The display 617 may include one or more light emitting diode (LED) indicator lights, or other such display devices. In addition, most computer systems 600 also include, or are connected to, one or more speakers and microphones 619 for audio output and input. Speech recognition software may be used in conjunction with the microphones 619 to receive and interpret user speech commands.

The invention may be implemented with any sort of processing units, processors and controllers (e.g., processor 601 of FIG. 6) capable of performing the stated functions and activities. For example, the processor 601 (or other processors used to implement the embodiments) may be a microprocessor, microcontroller, DSP, RISC processor, or any other type of processor that one of ordinary skill would recognize as being capable of performing the functions or activities described herein. A processing unit in accordance with at least one exemplary embodiment can operate computer software programs stored (embodied) on a computer-readable medium such as the internal memory 603, the storage drive 607, or other type of machine-readable medium, including for example, floppy disks, optical disks, a hard disk, CD, flash memory, ram, or other type of machine readable medium as recognized by those of ordinary skill in the art.

State holding elements, or state elements, are discussed above in terms of being implemented as registers. However, in some embodiments any sort of state holding element may be used to implement various embodiments, including for example, registers, latches, state machines, or any other like type of circuitry device or component.

Regarding the flowcharts depicted in FIGS. 1-5, it should be noted that the various method activities may be included or excluded as described above, or performed in a different order than shown in the figures, and still remain within the scope of at least one exemplary embodiment. For example, in some implementations of the FIG. 5 method the system may perform BDD sweeping for all nodes (step 505) rather than waiting for a node to be selected as part of replacing a netlist region with reduced circuitry. It is understood that the scope of the present invention encompasses other such omissions, additions, or changes to the flow charts and figures, as are known by those of ordinary skill in the art.

The computer software products or application programs can aid in the performance of, or perform, the various steps and activities described above. For example computer programs in accordance with at least one exemplary embodiment may include source code for obtaining BDD representations associated with various nodes in the netlist; identifying a reduction in the netlist by synthesizing one of the BDD representations as a netlist region associated with the node; and rewriting the netlist representation based on the identified reduction of the netlist region of the node. The various embodiments may include source code for the other activities illustrated in the figures or otherwise described herein. For example, there are many further source codes that may be written to perform the stated steps and procedures above, and these are intended to lie within the scope of exemplary embodiments.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method of redesigning a circuit by reducing a netlist representation of the circuit, wherein the circuit comprises a plurality of nodes including a node, the method comprising:
    obtaining through use of a computer a plurality of Binary Decision Diagram (BDD) representations associated with said node in the netlist;
    identifying a reduction in the netlist by synthesizing one of the plurality of BDD representations as a netlist region associated with the node;
    modifying the netlist representation using the identified netlist region associated with the node to produce a rewritten netlist representation; and
    redesigning the circuit based on the rewritten netlist representation.

2. The method of claim 1, further comprising:
    leveraging existing BDDs of nodes available from BDD-sweeping by evaluating said existing BDDs for use in rewriting logic for said nodes.

3. The method of claim 1, further comprising:
    identifying potential reduction regions associated with said node as portions of the netlist representation to rewrite; and
    building one or more of the plurality of BDD representations from the identified portions of the netlist representation;
    wherein predictive heuristics are used to identify the portions of the netlist representation to rewrite.

4. The method of claim 3, wherein the predictive heuristics include considering whether a region under consideration has fanouts outside the region.

5. The method of claim 1, wherein said at least one netlist region with redundancy is identified by performing binary decision diagram (BDD) sweeping.

6. The method of claim 5, wherein the BDD sweeping further comprises:
    identifying inputs and cut frontiers for the BDD sweep; and
    adding elements to build equivalent logic towards an output of the netlist region.

7. The method of claim 1, wherein the synthesizing of said one of the plurality of BDD representations as a netlist region associated with the node comprises converting said one of the plurality of BDD representations into the netlist region associated with the node.

8. The method of claim 1, wherein said node is a first node and said plurality of BDD representations is a first plurality of BDD representations, the method further comprising:
    obtaining through use of the computer a second plurality of BDD representations associated with a second node in the netlist.

9. A software product comprising a non-transitory machine readable medium including a program of instructions for redesigning a circuit by reducing a netlist representation of the circuit, wherein the circuit comprises a plurality of nodes including a node, wherein the program of instructions upon being executed on a computer causes the computer to perform activities comprising:
    obtaining a plurality of Binary Decision Diagram (BDD) representations associated with said node in the netlist;
    identifying a reduction in the netlist by synthesizing one of the plurality of BDD representations as a netlist region associated with the node;
    modifying the netlist representation using the identified netlist region associated with the node to produce a rewritten netlist representation; and
    redesigning the circuit based on the rewritten netlist representation.

10. The software product of claim 9, further comprising:
    leveraging existing BDDs of nodes available from BDD-sweeping by evaluating said existing BDDs for use in rewriting logic for said nodes.

11. The software product of claim 9, further comprising:
    identifying potential reduction regions associated with said node as portions of the netlist representation to rewrite; and
    building one or more of the plurality of BDD representations from the identified portions of the netlist representation;
    wherein predictive heuristics are used to identify the portions of the netlist representation to rewrite.

12. The software product of claim 11, wherein the predictive heuristics include considering whether a region under consideration has fanouts outside the region.

13. The software product of claim 9, wherein said at least one netlist region with redundancy is identified by performing binary decision diagram (BDD) sweeping.

14. The software product of claim 13, wherein the BDD sweeping further comprises:
    identifying inputs and cut frontiers for the BDD sweep; and
    adding elements to build equivalent logic towards an output of the netlist region.

15. The software product of claim 9, wherein the synthesizing of said one of the plurality of BDD representations as a netlist region associated with the node comprises converting said one of the plurality of BDD representations into the netlist region associated with the node.

16. The software product of claim 9, wherein said node is a first node and said plurality of BDD representations is a first plurality of BDD representations, the activities further comprising:
    obtaining a second plurality of BDD representations associated with a second node in the netlist.

17. A method of redesigning a circuit by reducing a netlist representation of the circuit, wherein the circuit comprises a plurality of nodes including a node, the method comprising:
    obtaining through use of a computer a plurality of Binary Decision Diagram (BDD) representations associated with said node in the netlist;

identifying a reduction in the netlist by synthesizing one of the plurality of BDD representations as a netlist region associated with the node;

creating a new netlist representation using the identified netlist region associated with the node; and redesigning the circuit based on the new netlist representation.

18. The method of claim 17, further comprising:

identifying potential reduction regions associated with said node as portions of the netlist representation to rewrite; and building one or more of the plurality of BDD representations from the identified portions of the netlist representation;

wherein predictive heuristics are used to identify the portions of the netlist representation to rewrite; and wherein the predictive heuristics include considering whether a region under consideration has fanouts outside the region.

19. The method of claim 17, wherein said at least one netlist region with redundancy is identified by performing binary decision diagram (BDD) sweeping.

20. The method of claim 19, wherein the BDD sweeping further comprises:

identifying inputs and cut frontiers for the BDD sweep; and adding elements to build equivalent logic towards an output of the netlist region.

21. The method of claim 17, wherein the synthesizing of said one of the plurality of BDD representations as a netlist region associated with the node comprises converting said one of the plurality of BDD representations into the netlist region associated with the node.

22. The method of claim 17, wherein said node is a first node and said plurality of BDD representations is a first plurality of BDD representations, the method further comprising:

obtaining through use of the computer a second plurality of BDD representations associated with a second node in the netlist.

23. A software product comprising a non-transitory machine readable medium including a program of instructions for redesigning a circuit by reducing a netlist representation of the circuit, wherein the circuit comprises a plurality of nodes including a node, and wherein the program of instructions upon being executed on a computer causes the computer to perform activities comprising:

obtaining a plurality of Binary Decision Diagram (BDD) representations associated with said node in the netlist;

identifying a reduction in the netlist by synthesizing one of the plurality of BDD representations as a netlist region associated with the node;

creating a new netlist representation using the identified netlist region associated with the node; and redesigning the circuit based on the new netlist representation.

24. The software product of claim 23, further comprising:

identifying potential reduction regions associated with said node as portions of the netlist representation to rewrite; and building one or more of the plurality of BDD representations from the identified portions of the netlist representation;

wherein predictive heuristics are used to identify the portions of the netlist representation to rewrite; and wherein the predictive heuristics include considering whether a region under consideration has fanouts outside the region.

25. The software product of claim 23, wherein said at least one netlist region with redundancy is identified by performing binary decision diagram (BDD) sweeping.

26. The software product of claim 23, wherein the BDD sweeping further comprises:

identifying inputs and cut frontiers for the BDD sweep; and adding elements to build equivalent logic towards an output of the netlist region.

27. The software product of claim 23, wherein the synthesizing of said one of the plurality of BDD representations as a netlist region associated with the node comprises converting said one of the plurality of BDD representations into the netlist region associated with the node.

28. The software product of claim 23, wherein said node is a first node and said plurality of BDD representations is a first plurality of BDD representations, the activities further comprising:

obtaining a second plurality of BDD representations associated with a second node in the netlist.

* * * * *